United States Patent
Damodaran et al.

(10) Patent No.: US 7,444,573 B2
(45) Date of Patent: Oct. 28, 2008

(54) VLCT PROGRAMMATION/READ PROTOCOL

(75) Inventors: Raguram Damodaran, Plano, TX (US); Ananthakrishnan Ramamurti, Irvine, CA (US); Ravi Lakshmanan, Shrewsbury, MA (US)

(73) Assignee: Texas Instruments Incorporated, Dallas, TX (US)

( * ) Notice: Subject to any disclaimer, the term of this patent is extended or adjusted under 35 U.S.C. 154(b) by 365 days.

(21) Appl. No.: 11/422,751

(22) Filed: Jun. 7, 2006

(65) Prior Publication Data

US 2007/0033472 A1 Feb. 8, 2007

Related U.S. Application Data

(60) Provisional application No. 60/688,914, filed on Jun. 9, 2005.

(51) Int. Cl.
*G01R 31/28* (2006.01)
(52) U.S. Cl. .......................... 714/733; 714/30; 714/31; 714/25; 714/718; 714/724; 714/734; 714/730
(58) Field of Classification Search .................. None
See application file for complete search history.

(56) References Cited

U.S. PATENT DOCUMENTS

| | | | | | |
|---|---|---|---|---|---|
| 5,640,509 | A | * | 6/1997 | Balmer et al. | 714/42 |
| 5,661,732 | A | * | 8/1997 | Lo et al. | 714/725 |
| 6,108,798 | A | * | 8/2000 | Heidel et al. | 714/30 |
| 6,553,527 | B1 | * | 4/2003 | Shephard, III | 714/733 |
| 7,168,005 | B2 | * | 1/2007 | Adams et al. | 714/31 |
| 2002/0194545 | A1 | * | 12/2002 | Abbott | 714/42 |

* cited by examiner

*Primary Examiner*—John P Trimmings
(74) *Attorney, Agent, or Firm*—Robert D. Marshall, Jr.; W. James Brady; Frederick J. Telecky, Jr.

(57) ABSTRACT

An integrated circuit with built-in self test enables internal data registers to be written to or read from via an external tester. In a command phase the programmable built-in self test unit receives a command, an address and a data transfer count. The address specifies the initial data register address. The data transfer count corresponds to the amount of data transferred and the number of cycle in the data access phase. The data access phase begins by accessing the data register corresponding to the address from the command phase. During subsequent cycles of the data access phase, the external tester accesses sequential data registers. The programmable built-in self test unit includes a pointer register and an adder to update the address each cycle of the data phase.

6 Claims, 2 Drawing Sheets

VLCT PROGRAMMATION/READ PROTOCOL

CLAIM OF PRIORITY

This application claims priority under 35 U.S.C. 119(e)(1) to U.S. Provisional Application No. 60/688,914 filed Jun. 9, 2005.

TECHNICAL FIELD OF THE INVENTION

The technical field of this invention is integrated circuit test systems.

BACKGROUND OF THE INVENTION

Testing fabricated integrated circuits to determine proper operation has always been a difficult problem. There are two major types of errors. A design defect means that the integrated circuit was manufactured to a design not proper for the intended purpose. Such a defect will effect every integrated circuit until the design is changed. The integrated circuit manufacturer must detect and correct such defects before shipping large number of parts to customers to avoid a costly recall. A manufacturing defect involves some fault in the manufacture of the integrated circuit that will effect less than all parts manufactured. Such defects are corrected by identification and correction of the manufacturing fault.

Most integrated circuit manufacturers test integrated circuits for proper function before shipment to customers. With the increase in integrated circuit complexity this testing is increasingly difficult. Many manufacturers rather than rely on increasingly expensive external testing devices test integrated circuits using a technique called built-in self test (BIST). BIST involves using circuits manufactured on the integrated circuit to test the integrated circuit. When triggered either automatically in circuit operation of by an external test device, the BIST circuits produce a set of test conditions run on the ordinary circuit hardware. Comparison of the state of the integrated circuit following test to an expected state indicates whether the integrated circuit passed the test. An example of such a test is writing to a read/write memory and recalling the data written. A match between the data written and the data read results in passing the test. BIST typically involves other more complex tests.

A subset of BIST is programmable built-in self test (pBIST) uses a general purpose test engine programmed by a set of instructions. This set of test instructions is typically stored on the integrated circuit in a read only memory (ROM) storing test instructions particularly developed for that integrated circuit. pBIST enables re-use of hardware and test instructions to cover a family of similar but not identical integrated circuits. pBIST typically does not have the ability to support go/no-go type of testing using an instruction ROM.

Current programmation of pBIST through the VLCT tester takes a long time. Also, there is no capability to perform reads of internal pBIST registers.

SUMMARY OF THE INVENTION

This invention is an integrated circuit with bulit-in self test. Test algorithms and test data are stored in read only memory. A programmable built-in self test unit includes data registers for storing the test algorithms and test data. These data registers may be written to or read from via an external tester.

The tester access operates in two phases. During a command phase the programmable built-in self test unit receives a command, an address and a data transfer count. Data access occurs during a data access phase including plural cycles. The command of the command phase specifies a data read or a data write. The address of the command phase specifies the initial data register address. The data transfer count corresponds to the amount of data transferred and the number of cycle in the data access phase.

The data access phase begins by accessing the data register corresponding to the address from the command phase. During subsequent cycles of the data access phase, the external tester accesses sequential data registers. The programmable built-in self test unit includes a pointer register storing a pointer indicating one of the data registers. This pointer is loaded with the address receive during the command phase. On successive cycles of the data access phase an adder sums the pointer value and 1 with the sum stored back into the pointer register.

This new protocol reduces the time to program pBIST and supports reading of internal pBIST registers.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
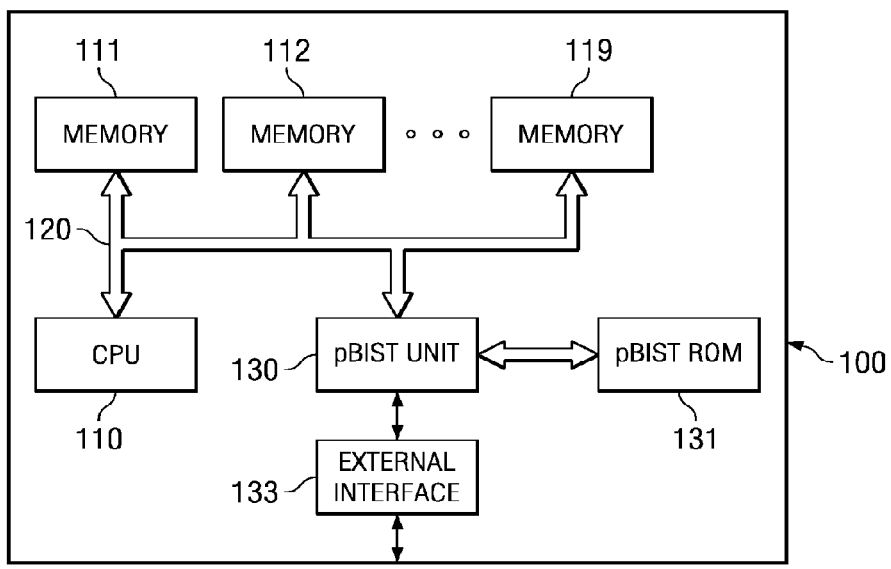
FIG. 1 is a block diagram of a typical integrated circuit including a programmable built-in self test unit (prior art)

FIG. 1 illustrates a typical integrated circuit 100 including programmable built-in self test. FIG. 1 illustrates integrated circuit 100 including central processing unit (CPU) 110 and memories 111, 112 . . . 119 coupled by bus 120. These circuits are merely representative of circuits embodied in an integrated circuit including pBIST.

The programmable built-in self test includes pBIST unit 130, pBIST ROM 131 and external interface 133. pBIST unit 130 controls the tests in much the same fashion as CPU 110 controls operation of integrated circuit 100. pBIST unit 130 is controlled by test instructions stored in pBIST ROM 131. pBIST unit 130 may couple to circuits outside integrated circuit 100 via external interface 133. FIG. 1 illustrates pBIST unit 130 coupled to CPU 110 and memories 111, 112 . . . 119 via bus 120. This connection is merely illustrative of the type of connection between pBIST unit 130 and other circuits of integrated circuit 100.

Figure 2:
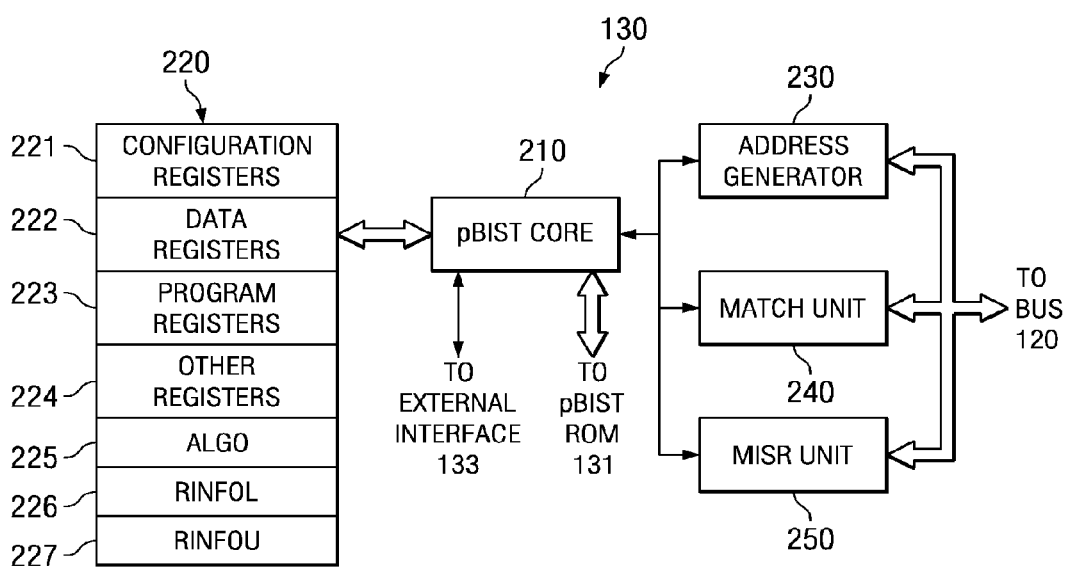
FIG. 2 is a block diagram of the programmable built-in self test unit of this invention.

FIG. 2 illustrates a more detailed view of pBIST unit 130. pBIST unit 130 includes pBIST core 210, registers 220, address generator 230, match unit 240 and MISR unit 250. pBIST core 210 is the center of pBIST unit 130. pBIST core 210 is coupled to registers 220, pBIST ROM 131, external interface 133, address generator 230, match unit 240 and MISR unit 250. Interaction of pBIST core 210 with these circuits will be further described below.

Registers 220 are preferrably memory mapped within the address space of CPU 110. Thus CPU 110 can read from or write to any register within registers 220 by a memory operation to a corresponding address. Registers 220 include configuration registers 221. Configuration registers 221 control the configuration of pBIST unit 130 and the operational mode of pBIST unit 130. Data registers 222 store test data recalled from pBIST ROM 131 in a manner more fully described below. Program registers 223 store test program instructions recalled from pBIST ROM 131 in a manner more fully described below. Other registers 224 include miscellaneous registers not fully described. Registers 220 includes three registers described in detail below: ALGO register 225; RINFOL register 226; and RINFOU 227.

The ALGO register 225 is an algorithm mask register. Bit [0] of this register indicates whether the first algorithm stored in the ROM would be executed or not. Bit [1] indicates whether the second algorithm is executed and so on. A total of 32 algorithms can be stored in the ROM as is determined by the data width of ALGO register 225. For an algorithm to be executed, both the corresponding bit of the ALGO register and a valid bit in the previous algorithm header must be set. The details of this valid bit will be further described below.

The RAM group mask registers RINFOL register 226 and RINFOU register 227 are similar to ALGO register 225. RAM group mask registers RINFOL register 226 and RINFOU register 227 indicate whether a particular RAM group is executed or not. This capability is provided because not all algorithms can be run on all memories. For a particular RAM group to be executed, the corresponding bit in RINFOL register 226 or RINFOU register 227 and the valid bit in the previous RAM group header must both be set. RINFOL register 226 indicates the validity of RAM groups 0 to 31 and RINFOU register 227 indicates the validity of RAM groups 32 to 63. These RAM groups will be further described below.

Figure 3:
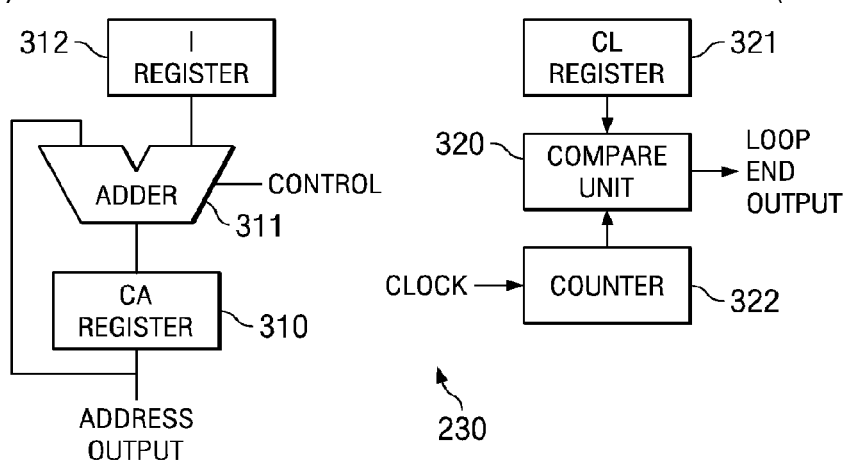
FIG. 3 is a block diagram of the address generation unit of the programmable built-in self test unit of FIG. 2.

Address generator 230 preferrable includes two address generators used in accessing memory, such as memories 111, 112 ... 119. FIG. 3 illustrates a block diagram of one of these address generators. Address generator 230 includes CA address register 310, adder 311, I increment register 312, compare unit 320, loop count register 321 and counter 322. In the preferred embodiment the initial values of address register CA 310, increment register 1312 and loop count register 321 are recalled from pBIST ROM 131. Adder 311 is controlled via a control input in one of three modes. In a non-increment mode, adder 311 returns an address output equal to the recycled value of CA register 310. The value of CA register 310 is thus unchanged. In an increment mode, adder 311 adds the values stored in CA register 310 and I increment register 312. The sum value is stored in CA address register 310 for the next iteration. The decement mode is similar to the increment mode, except adder 311 subtracts the value of I increment register 312 from the value of CA address register 310. The difference value is stored in CA address register 310 for the next iteration. The initial value of CL loop count register 321 sets the number of iterations in the loop. Compare unit 320 compares the value of CL loop count register 321 with the value of counter 322. Upon starting a test counter 322 is reset to zero. The count of counter 322 advances by one each cycle of the clock input. Compare unit 320 generates a loop end output when these two values match.

MISR unit 250 is mainly used for testing other chip-level ROMs. However, it can also be used to test any memory using any algorithm. When MISR unit 250 is used the return data from the memories is not compared to expected data and no failures would be triggered. The read data is fed directly into MISR unit 250 instead. The following polynomial is used by MISR unit 250:

$x^{32}+x^{22}+x^2+x+1$.

The tap points are bits 31, 30 and 10. The default value at the MISR output after reset is:

hex AAAAAAAA.

At the end of the memory test, the MISR signature is compared with the expected signature in the data register D1:D0 within other registers 224 to determine whether the test is passed or failed.

This invention also enables a Cumulative MISR mode. This mode is different from the MISR mode in two ways. First, the MISR signature comparison with the expected signature is done after testing all the memories in a particular RAM group and not after each individual memory. Second, this mode gives the programmer the capability to initially load a background pattern in data registers D1:D0 and E1:E0 within other registers 224 for the memory testing. After the memory testing is over, this mode loads a new value into these registers in order to use as expected signature. In other words, the first D1:D0 and E1:E0 values serve as the background pattern and the second D1:D0 and E1:E0 values serve as the expected signature. Any additional values for D1:D0 and E1:E0 will be ignored. Thus in CMISR mode, only the first two pairs of D1:D0 and E1:E0 values are used.

This invention includes hardware to speed reads or writes to pBIST unit 130. In particular this invention can be used to reduce the time to program internal registers in pBIST unit 130 from a very low cost tester (VLCT). In addition permitting reads of internal registers of pBIST unit 130 enables for better debugging.

The new protocol includes a command phase and a data phase. During the command phase, the VLCT provides a command, the address for which the command is directed and the number of data cycles that are going to follow this command phase. As an example, assume there are 16 bits available for programmation. Table 1 lists a division of these 16 bits for the command phase.

TABLE 1

| [15:14] | [13:6] | [5:0] |
|---------|--------|-------|
| cmd | address | data count |

For writes, the write command, write address and subsequent number of data cycles to follow the command phase are driven on this programmation bus. For reads, the read command, read address and the number of data cycles to wait for the data to be available are driven on this bus.

In Table 1 datacount is value=1 for a write. If datacount is 0, then no write would happen and the next command can be issued in the very next cycle. Address bits [12:6] specifies the word address to write to or read from in data registers 220 in pBIST unit 130. Bit (13) of this address is ignored. The cmd field has the values specified in Table 2.

TABLE 2

| cmd | command |
|-----|---------|
| 00 | NOOP |
| 01 | Write |
| 10 | Read |
| 01 | NOOP |

During the data phase, the data that needs to get written to this address is driven on the same programmation bus. As long as datacount from the command phase is =1, this bus will continue to carry 16-bit write data in subsequent cycles. After every data phase cycle where a new write data is driven, the value in datacount is automatically decremented by one. When datacount becomes 0, then there are no more data phase cycles left. The VLCT interface logic would then automatically start snooping the programmation bus for new commands.

For 32-bit writes, the datacount needs to be set to a value of 2, and the two cycles following the initial command phase will carry this 32-bit data (16 bits per cycle). To illustrate this more, consider the following example:

Command phase: hex 4002
Data phase: Cycle 1: 0x1FBD
Cycle 2: 0x2A00

Hex 4002 in binary would split as listed in Table 3:

TABLE 3

| [15:14] | [13:6]   | [5:0]  |
|---------|----------|--------|
| 01      | 00000000 | 000010 |

The command phase in this example implies that the command is a write to address hex 00 and that there are 2 cycles of data to follow. So the 32-bit value hex 2A001FBD would get written into this address location.

There is another advantage of doing things this way. For instance, let us assume a 16-deep 32-bit wide register file needs to be loaded with data. Following this protocol, this entire register file can be written using just a single command. To accomplish this, the programmer should issue the command hex 4020. This command decodes to state that there are 32 16-bit data cycles to follow—two for each line of this register file. In this case, the write to "0x0000" is automatically detected as a 32-bit write in hardware. So after every two data cycles, as long as datacount stays greater than or equal to 1, the word address is incremented by four and the data carried in the subsequent two cycles would form the write data for this newly calculated address.

Of course, each of these lines in the register file could also be written to one after the other by issuing separate commands with datacount equal to 2 for each command.

For reads, datacount specifies the number of cycles to wait after a read command is issued. The output data of the register addressed by address will be returned on the read data bus.

To explain this with an example, assume a read of an internal 32-bit register with a value 14 in the datacount field. pBIST unit 130 will stop snooping the programmation bus for the next 14 cycles after the command has been issued. The next VLCT command can only be issued on the fifteenth cycle. The lower 16 bits of the return data from this register would be available on the twelfth cycle and the upper 16 bits would be available on the thirteenth cycle. The fourteenth cycle is a dead cycle to support the cases where a single input/output bus is used for both programmation and read. In this case, the output enables for this bus could be switched back to write mode from read mode during this fourteenth cycle.

To generalize the above, the lower 16 bits will be available in datacount—2 cycle and the upper 16 bits will be available in datacount—1 cycle. The datacount cycle is a dead cycle during which the output enable could be switched, if needed.

If a read of an internal 16-bit register is issued, then the return data will be available in the datacount—2 cycle just like before. This data will stay the same and will not switch during the subsequent two cycles. Datacount is 6 bits so a maximum of 63 wait cycles can be specified after every read command.

The value to use for datacount depends on the internal clock frequency of pBIST unti 130. In other words, the exact time it takes to get the return data once the read address is issued depends entirely upon the internal pBIST clock frequency. The number of cycles to wait to get the return data should be calculated based on the following formula:

If reading register file data, $$D(\text{in } tck \text{ cycles}) = 6*tck + |(5*clkp)/tck|_{rounded}$$

If reading any other register data, $$D(\text{in } tck \text{ cycles}) = 6*tck + |(3*clkp)/tck|_{rounded}$$

Here tck represents the tester clock period and clkp represents the internal pBIST clock period. It takes two extra cycles to read the register file data because the access is pipelined on both sides of the register file due to timing considerations.

For cases where the tester clock is very slow compared to internal pBIST clock, it is fairly safe to assume that the read data would be available in 6 tester clock cycles. This can be obtained by setting clkp to a value of 0 in the above equations.

In order to calculate the worst case delay while doing reads, it is safe to assume that clkp frequency will always be at least twice that of tck. In other words, clkp period will be at most half the tck period. Substituting this in the above equations, we get:

If reading register file data, $$D(\text{in } tck \text{ cycles}) = 6*tck + |(5*0.5*tck)/tck|_{rounded} = 9 \text{ } tck \text{ cycles}$$

If reading any other register data, $$D(\text{in } tck \text{ cycles}) = 6*tck + |(3*0.5*tck)/tck|_{rounded} = 8 \text{ } tck \text{ cycles}$$

From the above calculations, we can conclude that the return data will be ready latest by 8 or 9 cycles depending on the register being read. If reading 32-bit registers, the lower 16 bits of data would be available on the ninth cycle, and the upper 16 bits of data would be available on the tenth cycle.

The programmer can bypass all these calculations and choose to specify, a suitably large value such as 16 in the datacount field. This would always ensure correct operation unless pBIST unit 130 operates on a clock frequency that is much slower than the tck frequency!

The input driver on the programmation bus can be tri-stated for the number of cycles specified in datacount. If the test designer specifies a datacount value of less than 10, then it is effectively treated as 10 internal to pBIST. In other words, the minimum datacount value that should be used is 10.

A lower width bus could be used for programmation in cases where a 16-bit programmation bus is not available. The only requirement is that the number of bits available for programmation be an integral power of 2. In other words, programmation widths of 1, 2, 4, 8 and 16 are supported.

In such cases, say when only 4 bits are available for programmation, then a simple logic would pack the available data every four cycles and issue a VLCT command or data phase. In other words, the first four cycles in this case would constitute the command phase and every four cycles following it would constitute the data for the subsequent data phase assuming datacount=1.

The above case does not take into account the control bits needed along with the programmation bits to implement this functionality. For example, you would need a single control bit for the case above that would indicate when the data packing has been completed and the packed data is ready to be written into pBIST unit 130.

Figure 4:
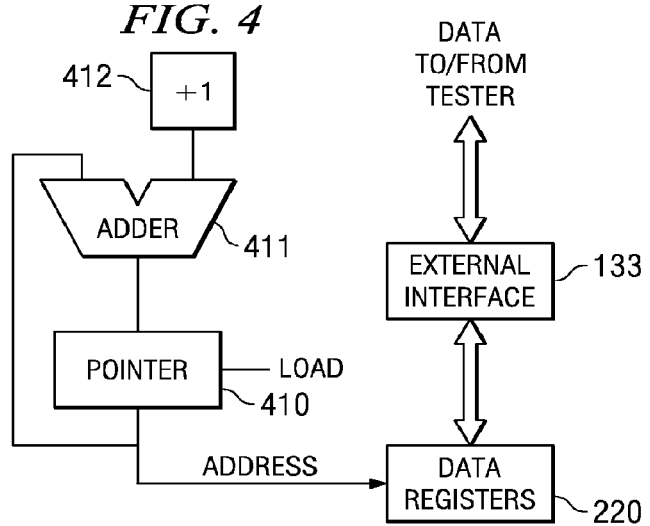
FIG. 4 illustrates the auto-increment feature for reads and writes to the data registers of the programmable built-in test unit of this invention.

FIG. 4 illustrates example hardware used in pBIST unit 130 to implement this protocol. Pointer 410 is loaded with the address from the address field of data received during the command phase. The initial data cycle uses this address to access the desired location within data registers 220. Following each data phase, adder 411 adds +1 from register 412 to the contents of pointer 410. The sum is stored in pointer 410 serving as the address for the next data cycle.

What is claimed is:

1. An integrated circuit comprising:
    a plurality of operational circuits to be tested;
    a test read only memory storing at least one test set consisting of a test algorithm and test data;
    an external tester interface; and
    a programmable built-in self test unit connected to said plurality of operational circuits to be tested, said test read only memory and said external tester interface, said programmable built-is self test unit including
        a plurality of read and write read and write data registers,
        a pointer register storing a pointer indicating one of said plurality of read and write read and write data registers,
        an adder having a first input connected to said pointer register, a second input receiving data equal to +1 and an output connected to said pointer register; and
    wherein said programmable built-in self test unit is operable to
        load from said test read only memory operable for each test set stored in said test read only memory said test algorithm and said test data,
        test at least one of said plurality of operational circuits to be tested according to said test algorithm and said test data loaded,
        enable access to said data registers indicated by said pointer register and increment said pointer register by said adder when in a tester access mode.

2. The integrated circuit of claim 1, wherein:
    said programmable built-in self test unit is further operable to
        enable access to said data registers in two phases, a command phase receiving commands from said tester via said tester interface, and a data access phase.

3. The integrated circuit of claim 2, wherein:
    said programmable built-in self test unit is operable in said command phase to receive a command, an address and a data transfer count.

4. The integrated circuit of claim 3, wherein:
    said programmable built-in self test unit is further operable to
        read data from a data register upon a read command, and write data to a data register upon a write command.

5. The integrated circuit of claim 3, wherein:
    said programmable built-in self test unit is further operable during said data access phase to access the said plurality of data registers corresponding to said data transfer count received during said command phase starting at said address received during said command phase.

6. The integrated circuit of claim 5, wherein:
    said programmable built-in self test unit is further operable to access a data register during a first cycle of said data access phase corresponding to said address received during said command phase, and
    access sequential data registers during subsequent cycles of said data access phase.

* * * * *